(12) United States Patent
Groenewold

(10) Patent No.: US 8,106,809 B2
(45) Date of Patent: Jan. 31, 2012

(54) SIGMA-DELTA CONVERTERS AND METHODS FOR ANALOG-TO-DIGITAL CONVERSION

(75) Inventor: Gerrit Groenewold, San Diego, CA (US)

(73) Assignee: Qualcomm Incorporated, San Dieg, CA (US)

( * ) Notice: Subject to any disclaimer, the term of this patent is extended or adjusted under 35 U.S.C. 154(b) by 42 days.

(21) Appl. No.: 12/464,491

(22) Filed: May 12, 2009

(65) Prior Publication Data

US 2010/0289682 A1 Nov. 18, 2010

(51) Int. Cl.
*H03M 1/12* (2006.01)

(52) U.S. Cl. ........................................ 341/172; 341/143

(58) Field of Classification Search .................. 341/143, 341/155, 172
See application file for complete search history.

(56) References Cited

U.S. PATENT DOCUMENTS

| | | | |
|---|---|---|---|
| 4,939,596 A | 7/1990 | Takayama | |
| 5,392,043 A * | 2/1995 | Ribner | 341/143 |
| 5,703,589 A * | 12/1997 | Kalthoff et al. | 341/172 |
| 6,201,835 B1 * | 3/2001 | Wang | 375/247 |
| 7,295,140 B2 * | 11/2007 | Chuang | 341/143 |
| 7,538,705 B2 * | 5/2009 | Deval et al. | 341/143 |
| 7,714,757 B2 * | 5/2010 | Denison et al. | 341/143 |
| 7,999,710 B2 * | 8/2011 | Matthews et al. | 341/143 |

OTHER PUBLICATIONS

YuQing Yang et al.; "A 114-dB 68-mW Chopper—Stabilized Stereo Multibit Audio ADC in 5.62 mm2", IEEE Journal of Solid-State Circuits, vol. 38, No. 12, Dec. 2003.
International Search Report and Written Opinion—PCT/US2010/034622—International Search Authority, European Patent Office, Nov. 5, 2010.
Yi-Gyeong Kim et al: "A 105.5 dB, 0.49 mm2 Audio I GBP I modulator using chopper stabilization and fully randomized DWA" Custom Integrated Circuits Conference, 2008. CICC 2008. IEEE, IEEE, Piscataway, NJ, USA, Sep. 21, 2008, pp. 503-506, XP031361509.

* cited by examiner

*Primary Examiner* — Brian Young
(74) *Attorney, Agent, or Firm* — Eric Ho

(57) ABSTRACT

A switched capacitor sigma-delta modulator or another analog-to-digital converter (ADC) uses chopper stabilization. Chopping clock transitions are performed during non-active periods of the sampling clock phases, reducing disturbance of the circuit caused by chopping and increasing the time available for settling of the circuit given a particular sampling frequency. An asynchronous state machine may govern sampling and chopping clock transitions. In embodiments, inactive transition of a first sampling clock causes inactive transition of a second chopping clock, which in turn causes active transition of a first chopping clock. The next inactive transition of the first sampling clock causes inactive transition of the first chopping clock, which causes an active transition of the second chopping clock.

42 Claims, 5 Drawing Sheets

SIGMA-DELTA CONVERTERS AND METHODS FOR ANALOG-TO-DIGITAL CONVERSION

BACKGROUND

1. Field

Apparatus and methods described in this document relate to electronic circuit designs. More specifically, the apparatus and methods relate to chopper-stabilized analog-to-digital converters and sigma-delta modulators.

2. Background

Sigma-delta modulators and other types of analog-to-digital converters (ADCs) are widely used in communication systems and in many other applications. In communication systems, for example, such devices may be used to convert an intermediate frequency (IF) signal to a baseband frequency signal, in order to meet dynamic range requirements for digital signal processing, and to provide improved adaptability and programmability to receiver circuitry. The advantages of sigma-delta modulators include high dynamic range, which is often needed to distinguish a small desired signal from blockers and interferers. Sigma-delta modulators shape the quantization noise out-of-band, and allow combining decimation filtering with selective digital filtering and IF mixing to attenuate both the quantization noise and neighboring blockers. In addition, the ability to select different sampling rates in the sigma-delta modulator architecture allows a single device to be adapted to different requirements, for example, the requirements imposed by multiple RF standards. Moreover, the use of higher sampling rates and complex digital signal processing allow sigma-delta converters to exhibit relatively low sensitivity to interfering analog signals.

One-over-f (1/f) noise is one type of noise at the output of a typical converter (which word herein applies to sigma-delta modulators and ADCs). One-over-f noise is difficult to reduce because it lies in the same band as the converted signal, making it difficult to filter the noise out of the converted signal. Generally, reducing such noise is costly in terms of chip area and power consumption.

In chopper-stabilized converter topologies, input and output polarities are simultaneously switched in one or more of the converter integrators (generally the first integrator from the input). Because the input and output polarities are switched at about the same time, the combined polarity of the integrator and of the converter are unaffected. The switching of the input and output polarities in the one or more integrators (so-called "chopping") translates the processed signal inside the operational amplifier (op amp) of the integrator to the higher frequency with which chopping is performed. If the chopping frequency is sufficiently high, the 1/f noise is translated well above the low frequency (e.g., above the audio frequency of less than 20 KHz) of the processed signal. It is easier then to filter out the 1/f noise translated to the higher frequency.

An interested reader may wish to examine Early, U.S. Pat. No. 4,939,516, for more information on chopper-stabilized converters. Another source is YuQing Yang et al. A 114-DB 68-MW CHOPPER-STABILIZED STEREO MULTIBIT AUDIO ADC IN 5.62 MM², 38 IEEE Journal of Solid-State Circuits 12, at pp. 2061-68 (IEEE 2003).

Chopping is typically done in the middle of the clock phase of the sampling clock of the converter. It takes some time for things to settle down after switching, and if settling time is long compared to the sampling clock period, settling problems may lead to settling distortion. The upper limit on the settling time is thus imposed by the sampling frequency, which is a function of oversampling ratio. Because higher oversampling ratios improve overall system signal-to-noise ratio (SNR), oversampling ratio is a system requirement and is preferably maintained at a relatively high number. Settling time may also be improved by certain design techniques, but such techniques are generally costly from power consumption perspective.

Size, power consumption, speed, SNR, and production costs loom large in designing electronic equipment, and especially portable battery-operated electronic equipment such as wireless access terminals. Therefore, there is a need in the art to improve SNR and reduce the power consumption of electronic equipment, including sigma-delta modulators and ADCs. There is also a need in the art to decrease size and weight of electronic equipment, including sigma-delta modulators and ADCs. There is a further need in the art to lower the cost of manufacturing electronic equipment, including sigma-delta modulators and other devices that include integrators and summers.

SUMMARY

Embodiments disclosed herein may address one or more of the above stated needs by providing chopper-stabilized converters wherein chopping is performed at specific time and/or in accordance with specific clock transition sequences.

In an embodiment, a switched capacitor converter includes a summer, a quantizer, at least one integrator, and a clock generator module. The summer, the quantizer, and the at least one integrator are configured as a chopper-stabilized sigma-delta modulator. The clock generator module is configured to generate a first phase of a sampling clock, a second phase of the sampling clock, a first phase of a chopping clock, and a second phase of the chopping clock. The first and second phases of the sampling clock are non-overlapping, and the first and second phases of the chopping clock are non-overlapping. The clock generator module is configured to cause transitions from active to inactive of the first and second phases of the chopping clock when the first phase and the second phase of the sampling clock are inactive.

In an embodiment, a switched capacitor converter includes a summer, a quantizer, at least one integrator, and a clock generator module. The summer, the quantizer, and the at least one integrator are configured as a chopper-stabilized sigma-delta modulator. The clock generator module is configured to generate a first phase of a sampling clock, a second phase of the sampling clock, a first phase of a chopping clock, and a second phase of the chopping clock. The first and second phases of the sampling clock are non-overlapping, and the first and second phases of the chopping clock are non-overlapping. The clock generator module includes means for causing transitions from active to inactive of the first and second phases of the chopping clock when the first phase and the second phase of the sampling clock are inactive, and for causing transitions from inactive to active of the first and second phases of the chopping clock when the first phase and the second phase of the sampling clock are inactive.

In an embodiment, a method of analog-to-digital conversion includes providing a switched capacitor, chopper-stabilized sigma-delta modulator that has a summer, a quantizer, and at least one integrator. The method also includes generating a first phase of a sampling clock, a second phase of the sampling clock, a first phase of a chopping clock, and a second phase of the chopping clock. The first and second phases of the sampling clock are non-overlapping, and the first and second phases of the chopping clock are non-overlapping. Transitions from active to inactive of the first and second phases of the chopping clock occur only when the first phase and the second phase of the sampling clock are inactive. The method additionally includes providing the first phase of the sampling clock and the second phase of the sampling clock to the modulator for switching capacitors of the modulator. The method further includes providing the first phase of the chopping clock and the second phase of the chopping clock to the at least one integrator for chopper stabilization of the modulator.

In an embodiment, a method of analog-to-digital conversion includes providing a switched capacitor, chopper-stabilized sigma-delta modulator that has at least one summer, a quantizer, and at least one integrator. The method also includes a step for generating a first phase of a sampling clock, a second phase of the sampling clock, a first phase of a chopping clock, and a second phase of the chopping clock, the first and second phases of the sampling clock being non-overlapping, the first and second phases of the chopping clock being non-overlapping, wherein transitions from active to inactive of the first and second phases of the chopping clock occur when the first phase and the second phase of the sampling clock are inactive, and transitions from inactive to active of the first and second phases of the chopping clock occur when the first phase and the second phase of the sampling clock are inactive. The method additionally includes providing the first phase of the sampling clock and the second phase of the sampling clock to the modulator for switching capacitors of the modulator. The method further includes providing the first phase of the chopping clock and the second phase of the chopping clock to the at least one integrator for chopper stabilization of the modulator.

These and other embodiments and aspects of the present invention will be better understood with reference to the following description, drawings, and appended claims.

DETAILED DESCRIPTION

In this document, the words "embodiment," "variant," and similar expressions are used to refer to particular apparatus, process, or article of manufacture, and not necessarily to the same apparatus, process, or article of manufacture. Thus, "one embodiment" (or a similar expression) used in one place or context may refer to a particular apparatus, process, or article of manufacture; the same or a similar expression in a different place may refer to a different apparatus, process, or article of manufacture. The expression "alternative embodiment" and similar phrases may be used to indicate one of a number of different possible embodiments. The number of possible embodiments is not necessarily limited to two or any other quantity.

The word "exemplary" may be used herein to mean "serving as an example, instance, or illustration." Any embodiment or variant described herein as "exemplary" is not necessarily to be construed as preferred or advantageous over other embodiments or variants. All of the embodiments and variants described in this description are exemplary embodiments and variants provided to enable persons skilled in the art to make and use the invention, and not necessarily to limit the scope of legal protection afforded the invention.

The words "buffer" and "amplifier" are used interchangeably, each encompassing the functions of amplification, attenuation, buffering, buffering with amplification, and buffering with attenuation. Buffers and amplifiers can be configured to function (process signals) in analog or digital domain, depending on the specific type of the signal involved.

In the context of discussion of falling and rising edges of different sampling and chopping clock phases, the word "cause" and its various inflectional morphemes are used to indicate causation and/or sequencing. Thus, "a first edge causing a second edge" can be understood as direct or indirect causation of the second edge by the first edge; the same phrase can also be understood in the sense of "the second edge must follow the first edge."

"Non-overlapping" phases of a clock means that the phases of the same clock are not active at the same time. A phase that is active typically closes switches controlled by the phase.

Figure 1:
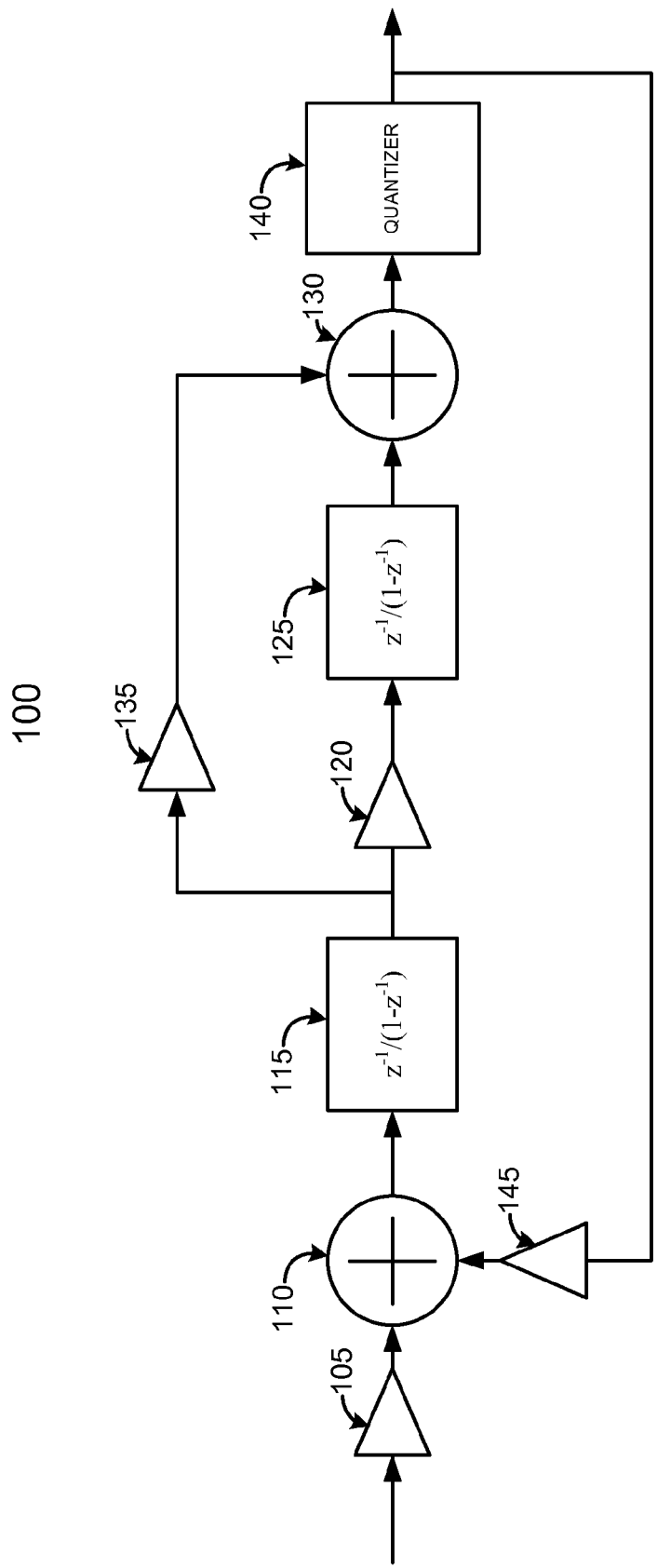
FIG. 1 illustrates selected blocks of a sigma-delta modulator.

FIG. 1 illustrates selected blocks of an exemplary sigma-delta modulator 100. The sigma-delta modulator 100 includes an input buffer/amplifier 105, a summer 110, an integrator 115, an intermediate amplifier 120, another integrator 125, another summer 130, a feedforward amplifier 135, a quantizer 140, and a feedback digital-to-analog converter 145. These blocks are arranged as illustrated in FIG. 1, in this embodiment.

Selected or all of the analog blocks of the sigma-delta modulator 100 may be implemented using switched capacitor circuits. In switched capacitor circuit designs, charge is moved between different capacitors by switches opened and closed using different clock phases. Typically, the clock phases are non-overlapping, so that some switches are on while others are off, and vice versa.

The quantizer 140 may be a single-bit quantizer such as a comparator, or it may be a multi-bit quantizer. In an exemplary variant, the quantizer 140 is a two-bit quantizer. Longer bit-lengths are also possible. As is typical, the bit-length (resolution of the quantizer) is lower than resolution of the output of the sigma-delta modulator 100.

Figure 2:
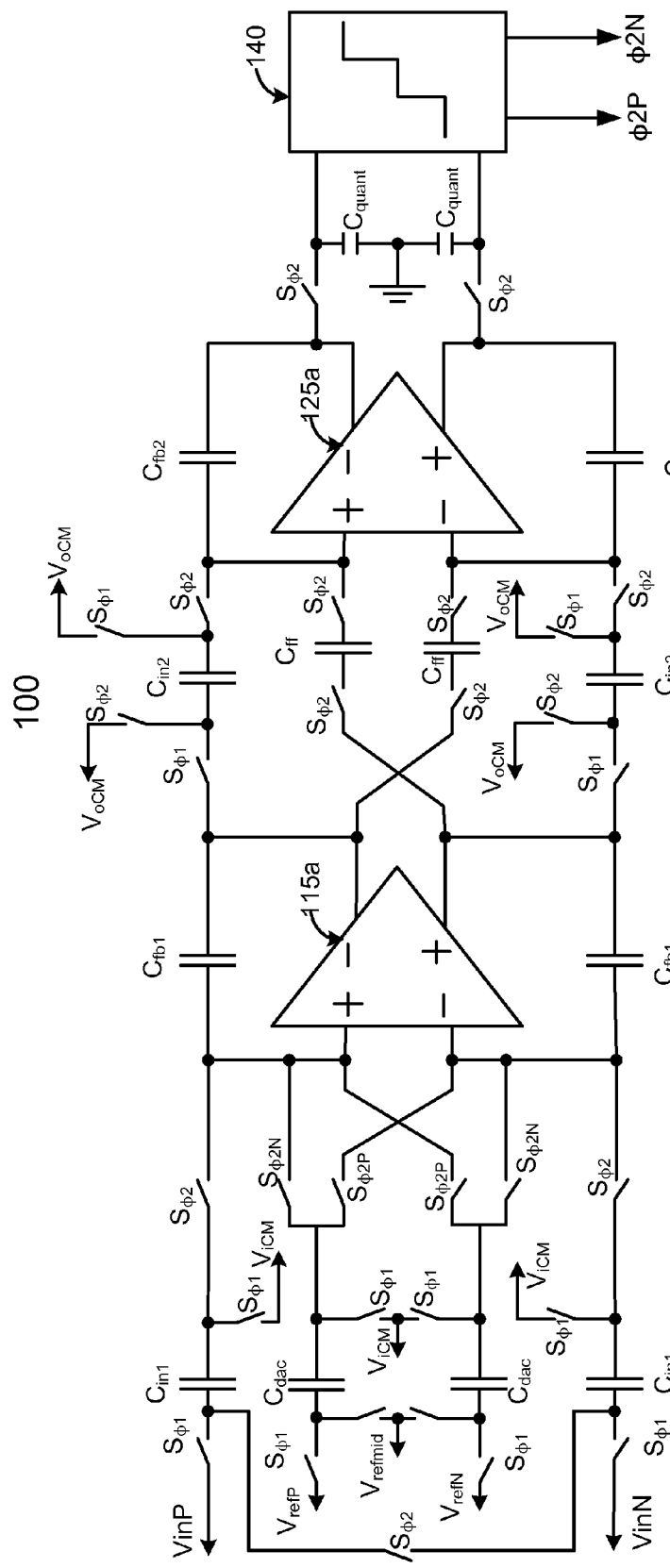
FIG. 2 illustrates selected components of a switched capacitor differential sigma-delta modulator embodiment of FIG. 1.

FIG. 2 is an expanded view of selected components of a differential variant of the sigma-delta modulator 100. Turning first to notation, $V_{inP}$ and $V_{inN}$ stand for positive and negative differential input voltages, while φ2P and φ2N are signals indicating results of the previous quantization comparison performed by the quantizer 140. In general, one of the two signals φ2P and φ2N, under control of the output signal of the quantizer, is active when φ2 is active. Switches $S\phi_1$ are turned on (closed) by one phase of the switching or sampling clock being active, the two phases being non-overlapping. The switches $S\phi_2$ are turned on by the second phase of the switching or sampling clock being active. Similarly, $S_{\phi P}$ are switches turned on by φ2P, and $S_{\phi N}$ are switches turned on by φ2N. Differential reference voltages $V_{refP}$ and $V_{refN}$ define the range of valid inputs to the sigma-delta modulator 100, while $V_{refmid}$ is the reference voltage in the middle of the range defined by $V_{refP}$ and $V_{refN}$. Note that in variants the sampling and integration phases may be reversed.

Capacitors $C_{ff}$ are feed forward capacitors in the path defined by the amplifier 135 (of FIG. 1); note that in the variant of FIG. 2 there is no active device corresponding to the amplifier 135. The capacitors $C_{fb1}$ and $C_{fb2}$ are feedback capacitors for the integrators 115 and 125. The capacitors $C_{in1}$ and $C_{in2}$ form parts of the summers 110 and 130, respectively. The capacitors $C_{DAC}$ may be considered to be a part of the summer 110, the integrator 115, and/or the feedback DAC 145. And the capacitors $C_{quant}$ are essentially sample-and-hold capacitors at the inputs to the quantizer 140.

The devices 115a and 125a are active devices of the integrators 115 and 125, respectively. Note that in this embodiment each of these active devices also implements one of the summers; thus the device 115a is part of the integrator 115 and the summer 110, while the device 125a is part of the integrator 125 and the summer 130. As will be discussed in more detail below, at least one of these devices is configured with chopper stabilization where chopper stabilization is performed in a particular way described below. Because the first integrator (built around the device 115a, nearest the input of the sigma-delta modulator 100) contributes the bulk of the 1/f noise, in some embodiments only the active device of the first integrator employs chopper stabilization as described in this document.

Lastly, block 180 in FIG. 2 is a clock generator configured to generate the phases $\phi1$ and $\phi2$ of the sampling clock, as well as phases T1 and T2 of the chopping clock described in more detail below. Typically, the delay or phase difference between $\phi1$ and $\phi2$ is asynchronous, as is the delay between the phases T1 and T2. At the same time, $\phi1$ and $\phi2$ are different phases of the same sampling clock, and therefore operate at the same frequency. Similarly, T1 and T2 are phases of the same chopping clock, and operate at the same frequency. The chopping clock frequency is the sampling frequency divided down by an integer, in this embodiment. In variants, the divide by number is programmable, and may be equal to two or any other integer greater than one.

Figure 3:
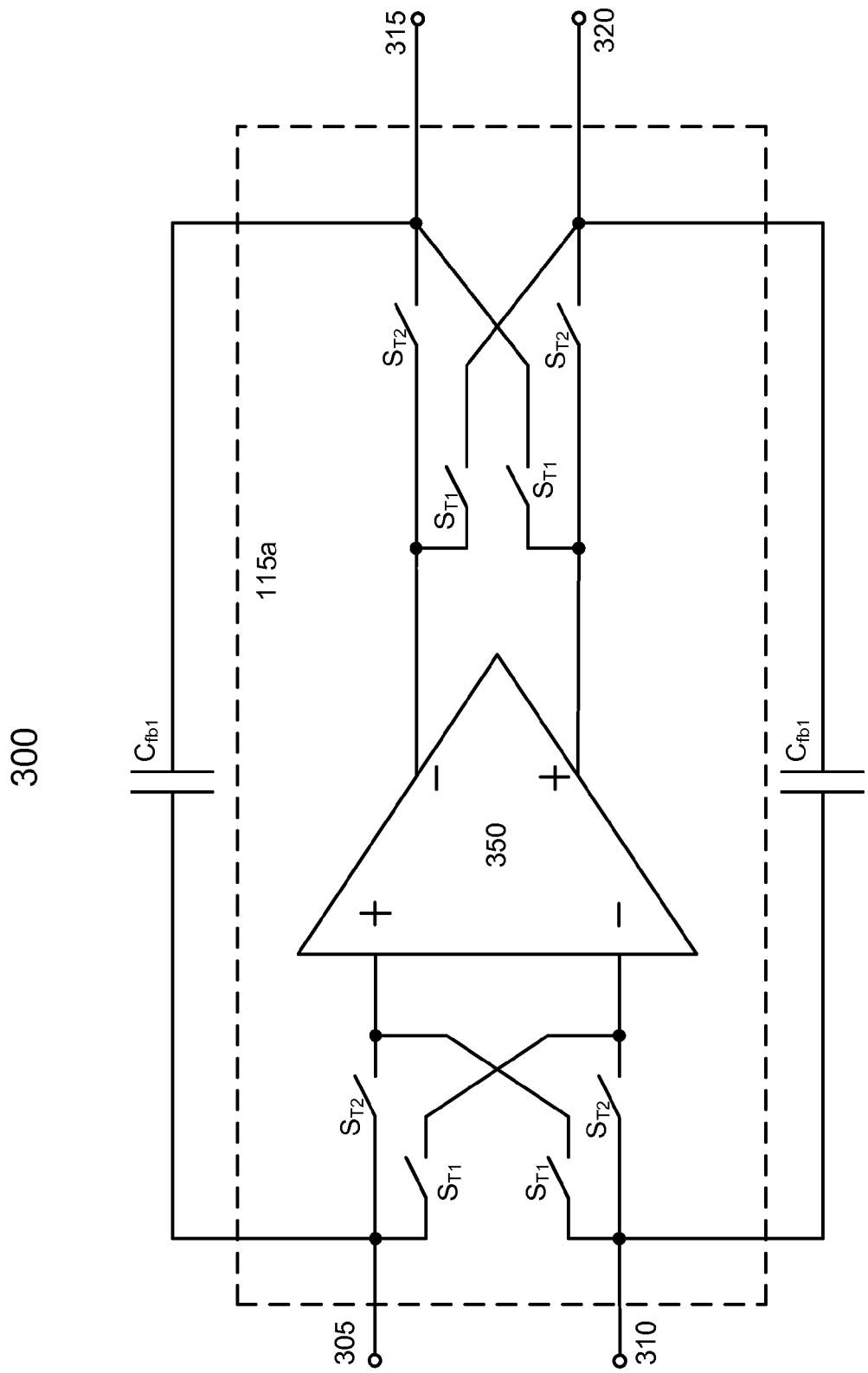
FIG. 3 illustrates selected components of a combination of an active device and feedback capacitors used in the sigma-delta modulator of FIG. 2.

FIG. 3 is an expanded view of selected components of a combination 300 of the active device 115a (within dashed lines) and the capacitors $C_{fb1}$, which uses chopper stabilization as described below. Note that the same principles may be applied to other active devices in other summers/integrators of the sigma-delta modulator, for example, to the active device 125a. In FIG. 3, the non-inverting input 305 corresponds to the positive input (+) of the active device 115a (as shown in FIG. 2), the inverting input 310 corresponds to the negative (−) input of the device 115a, the negative output 315 corresponds to the negative output of the device 115a, and the positive output 320 corresponds to the positive output of the device 115a.

The active device 115a includes an operational amplifier or a similar differential device 350 (i.e., a device with high input impedances, low output impedances, and high gain). The inputs to the opamp 350 are connected to the inputs of the active device 115a through a set of four switches; similarly, the outputs of the opamp 350 are connected to the outputs of the active device 115a through another set of four switches. As shown, the switches $S_{T1}$ are turned on when a phase T1 of a chopping clock is active, and the switches $S_{T2}$ are turned on when another phase T2 of the chopping clock is active. Thus, the inputs and the outputs can be interchanged so that no change results in the transfer function of the combination 300 or the integrator/summer in which it is employed. The non-overlapping period of two phases of the clock may be divided substantially equally on each side of the active period of the clock (or of each phase of the clock). For example, there may be a five percent non-overlapping period in front of the rising edge and following the falling edge of an active high clock.

In embodiments, the phases T1 and T2 are non-overlapping, as are the two phases $\phi1$ and $\phi2$ of the sampling clock. For example, the duty cycles of the non-overlapping clocks may be somewhat below fifty percent, for example forty percent or some other value between forty and fifty percent. The chopping clock may be derived from the sampling clock, for example, it can be generated by an oscillator phase-locked to the sampling clock, or by another frequency divider circuit. In embodiments, the chopping clock frequency is equal to the sampling clock frequency divided by a whole integer. In particular variants, the frequency of the chopping clock is half that of the sampling clock, allowing for the highest chopping frequency for a given sampling frequency.

Figure 4:
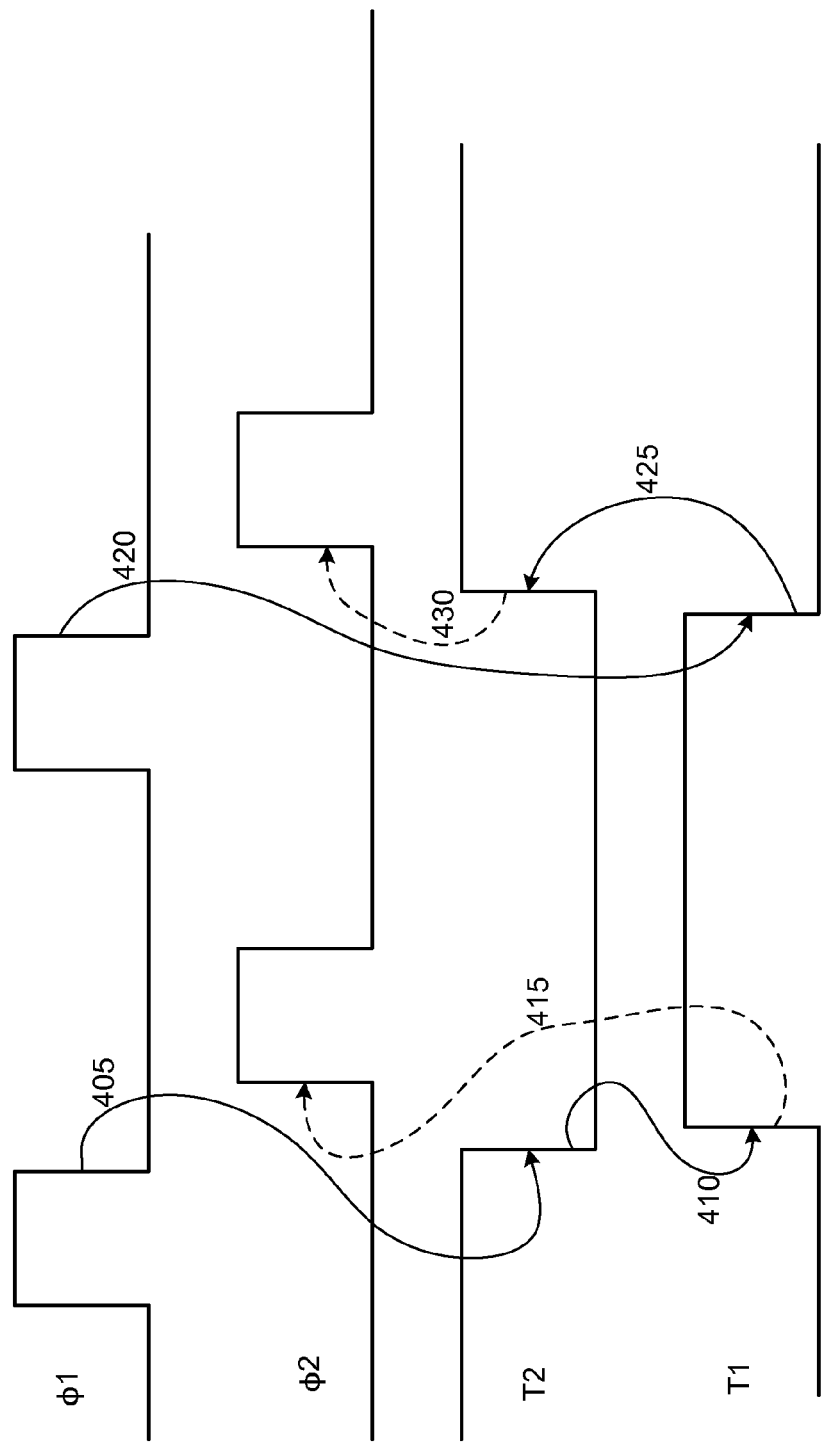
FIG. 4 illustrates a timing sequence of sampling and chopping clock phases in the sigma-delta modulator of FIG. 2.

In operation, the two integrators 115 and 125 sample their input signals during the active period of the sampling clock phase $\phi1$. When $\phi2$ (the other phase of the sampling clock) is active, these samples are integrated. At the end of $\phi2$, the integrated samples are available at the output of the respective integrators. During the subsequent active period of $\phi1$, the second integrator 125 samples the output signal of the first integrator. After the second integrator 125 has taken its sample, the chopping phase of the first integrator can change without affecting the sample that the second integrator has taken. A good time to toggle the chopping clock phases is therefore following the active period of $\phi1$. Toggling the chopping phases T1 and T2 should generally take as little time as practicable, so that the first integrator 115 has enough time to settle. Then, the phases T1 and T2 of the chopping clock may be toggled in the active phase of $\phi2$. In embodiments, however, the chopping clock phases T1 and T2 are toggled in the non-overlapping interval between $\phi1$ and $\phi2$, as is shown in FIG. 4. With the clock phases arranged as in FIG. 4, the chopping clock is half the frequency of the sampling clock. In other embodiments, chopping is performed at lower frequencies. Note again that in variants the sampling and integration phases ($\phi1$ and $\phi2$) may be reversed.

Note that while the sampling and chopping clocks may be synchronized, the timing of one of the phases of each of these clocks is typically asynchronous. This is so because the delay of a fraction of the period of the sampling clock is typically introduced through one or more gates or a transmission line; the delay is thus not clock-dependent.

Figure 5:
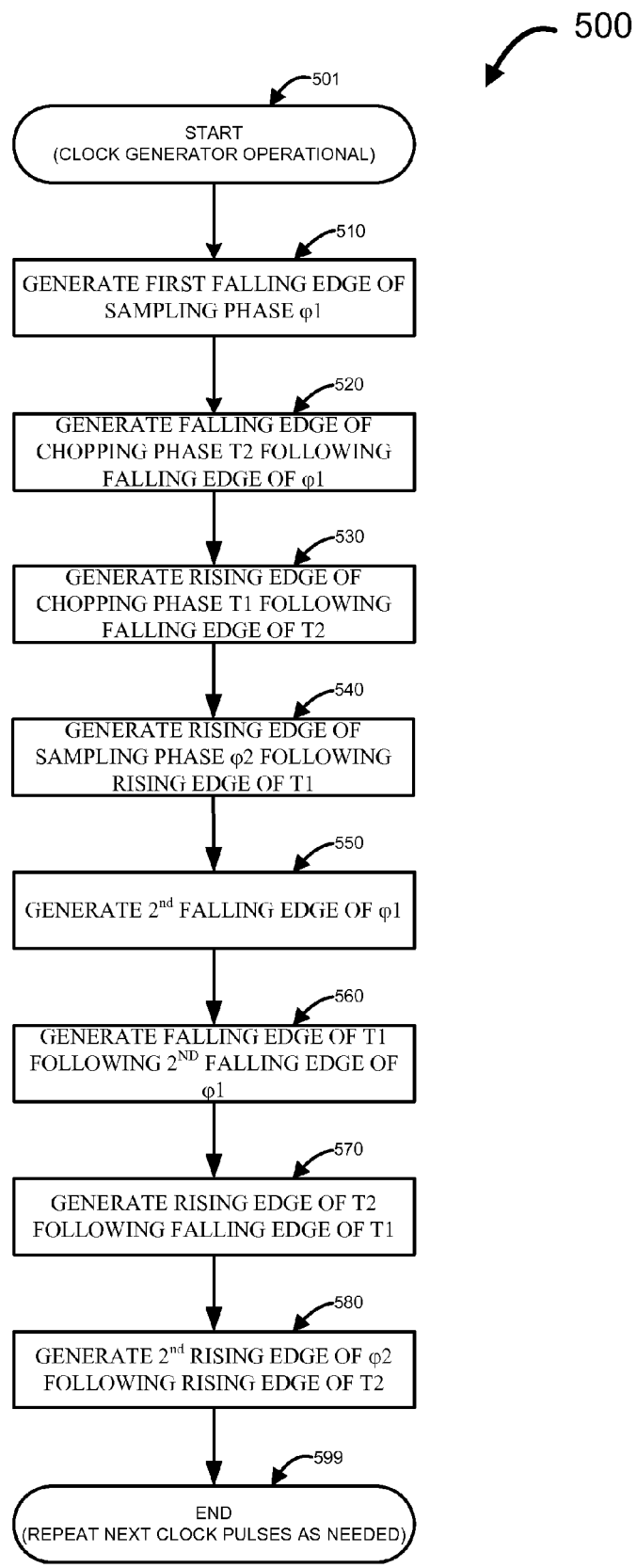
FIG. 5 illustrates selected steps of a method performed by a state machine in transitioning the phases of the clocks shown in FIG. 4.

FIG. 4 illustrates a typical sequence 400 of timing phases in an embodiment where the chopping clock (phases T1 and T2) operates at one-half frequency of the sampling clock (phases $\phi1$ and $\phi2$). FIG. 5 illustrates selected steps of a method 500 performed by the asynchronous state machine in the process of changing the four phases of the two clocks (sampling and chopping). The state machine may be part of the clock generator 180 of FIG. 2.

At flow point 501, the sampling and chopping clock generator is operational.

At step 510, a first falling edge (leftmost) of the first sampling phase $\phi1$ is generated, whereby the first sampling phase becomes inactive. This transition causes (after a small and typically asynchronous delay) a falling edge in the second chopping phase T2, whereby the second chopping clock becomes inactive. The causation is indicated by an arrow 405, and corresponds to step 520.

At step 530, the falling edge of T2 causes (after a small and typically asynchronous delay) a rising edge of the first chopping clock phase T1, transitioning the phase T1 to the active state. This transition causation is indicated by an arrow 410.

At step 540, the rising edge of T1 causes (after a small and typically asynchronous delay) a rising edge in the second sampling clock phase $\phi2$, transitioning $\phi2$ to the active state. This transition causation is indicated by a dashed arrow 415.

The arrow is dashed because the causation or relationship may be omitted in some embodiments.

Turning next to the second (next following or rightmost) pulse of φ1, at step 550 a second falling edge of φ1 is generated. As can be observed from FIG. 4, the second edge discussed here belongs to the next φ1 pulse, i.e., the pulse immediately following the pulse of the first falling edge of φ1 discussed above.

At step 560, the second falling edge of φ1 causes (after a small and typically asynchronous delay) a falling edge of T1. This causation is indicated by an arrow 420. Note that the falling and rising edges of T1 discussed in relation to FIG. 4 belong to the same pulse of T1.

At step 570, the falling edge of T1 causes (after a small and typically asynchronous delay) a rising edge of T2. Note that this rising edge of T2 belongs to the pulse of T2 that immediately follows the T2 pulse that contained the falling edge of T2 discussed above. The causation of the rising edge of T2 by the falling edge of T1 is indicated with an arrow 425.

Next, at step 580, the rising edge of T2 causes (after a small and typically asynchronous delay) a second rising edge of φ2. This second rising edge of φ2 belongs to the pulse of φ2 that immediately follows the pulse of which the first rising edge of φ2 (discussed above) was a part. The causation of the second rising edge of φ2 by the rising edge of T2 is indicated with a dashed arrow 430. The arrow is dashed because the causation or relationship may be omitted in some embodiments. Thus, the rising edge of T2 may, in some embodiments, occur at the same time or even later than the second rising edge of φ2.

The process 500 then terminates at a flow point 599. It should be understood that in normal operation the steps of the process continue to be repeated during the generation of the clocks and operation of the converter in which the clocks operate.

Although steps and decisions of various methods may be described serially in this disclosure, some of these steps and decisions may be performed by separate elements in conjunction or in parallel, asynchronously or synchronously, in a pipelined manner, or otherwise. There is no particular requirement that the steps and decisions be performed in the same order in which this description lists them, except where explicitly so indicated, otherwise made clear from the context, or inherently required. It should be noted, however, that in selected variants the steps and decisions are performed in the particular sequences described and/or shown in the accompanying Figures. Furthermore, not every illustrated step and decision may be required in every embodiment or variant, while some steps and decisions that have not been specifically illustrated may be desirable in some embodiments/variants.

Those of skill in the art would understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Those of skill in the art would further appreciate that the various illustrative logical blocks, modules, circuits, and algorithm steps described in connection with the embodiments disclosed herein may be implemented as electronic hardware, computer software, or combinations of both. To show clearly this interchangeability of hardware and software, various illustrative components, blocks, modules, circuits, and steps may have been described above generally in terms of their functionality. Whether such functionality is implemented as hardware, software, or combination of hardware and software depends upon the particular application and design constraints imposed on the overall system. Skilled artisans may implement the described functionality in varying ways for each particular application, but such implementation decisions should not be interpreted as causing a departure from the scope of the present invention.

The various illustrative logical blocks, modules, and circuits described in connection with the embodiments disclosed herein may be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g. a combination of a DSP and a microprocessor, a plurality of microprocessors, one or more microprocessors in conjunction with a DSP core, or any other such configuration.

The steps of a method or algorithm that may have been described in connection with the embodiments disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in an access terminal. Alternatively, the processor and the storage medium may reside as discrete components in an access terminal.

The previous description of the disclosed embodiments is provided to enable any person skilled in the art to make and use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein, but is to be accorded the widest scope consistent with the principles and novel features disclosed herein.

What is claimed is:

1. A switched capacitor converter comprising:
    a first summer;
    a quantizer;
    at least one integrator, the first summer, the quantizer, and the at least one integrator being configured as a chopper-stabilized sigma-delta modulator; and
    a clock generator module configured to generate a first phase of a sampling clock, a second phase of the sampling clock, a first phase of a chopping clock, and a second phase of the chopping clock, the first and second phases of the sampling clock being non-overlapping, the first and second phases of the chopping clock being non-overlapping, the clock generator module being configured to cause transitions from active to inactive of the first and second phases of the chopping clock when the first phase and the second phase of the sampling clock are inactive, wherein the clock generator module is further configured to cause transitions from inactive to active of the first and second phases of the chopping clock when the first phase and the second phase of the sampling clock are inactive, and wherein the clock generator module is further configured to cause at least one transition from inactive to active of the second phase of the sampling clock in response to inactive to active transitions of the first phase of the chopping clock, and to cause at least one transition from inactive to active of the second phase of the sampling clock in response to inactive to active transitions of the second phase of the chopping clock.

2. A switched capacitor converter according to claim 1, wherein the clock generator module comprises an asynchronous state machine for controlling clock transitions.

3. A switched capacitor converter according to claim 2, wherein the quantizer is a comparator.

4. A switched capacitor converter according to claim 2, wherein the quantizer is a two-bit quantizer.

5. A switched capacitor converter according to claim 2, wherein the quantizer is a multi-bit quantizer.

6. A switched capacitor converter according to claim 2, wherein the asynchronous state machine comprises one or more means for delaying the clock transitions.

7. A switched capacitor converter according to claim 2, further comprising:
a second summer; and
a feedforward amplifier in a feedforward path between the first integrator of the at least one integrator and the second summer.

8. A switched capacitor converter according to claim 7, further comprising a feedback digital-to-analog converter in a feedback path from the quantizer to the first summer.

9. A switched capacitor converter according to claim 8, wherein the at least one integrator comprises a plurality of integrators, wherein each integrator of the plurality of integrators is configured with chopper stabilization.

10. A switched capacitor converter according to claim 8, wherein the at least one integrator comprises a first integrator and a second integrator, the first integrator being coupled to the first summer to receive output of the first summer, the second integrator being coupled to the second summer to provide an input to the second summer, wherein the first integrator is configured with chopper stabilization, and the second integrator is configured without chopper stabilization.

11. A switched capacitor converter according to claim 8, wherein the at least one integrator is configured for differential operation.

12. A switched capacitor converter according to claim 8, wherein the clock generator module is configured so that frequency of the sampling clock is equal to twice frequency of the chopping clock.

13. A switched capacitor converter according to claim 8, wherein the clock generator module is configured so that frequency of the sampling clock is equal to an integer multiple of frequency of the chopping clock, the integer multiple being greater than 1.

14. A switched capacitor converter comprising:
a summer;
a quantizer;
at least one integrator, the summer, the quantizer, and the at least one integrator being configured as a chopper-stabilized sigma-delta modulator; and
a clock generator module configured to generate a first phase of a sampling clock, a second phase of the sampling clock, a first phase of a chopping clock, and a second phase of the chopping clock, the first and second phases of the sampling clock being non-overlapping, the first and second phases of the chopping clock being non-overlapping, the clock generator module comprising:
means for causing transitions from active to inactive of the first and second phases of the chopping clock when the first phase and the second phase of the sampling clock are inactive;
means for causing transitions from inactive to active of the first and second phases of the chopping clock when the first phase and the second phase of the sampling clock are inactive;
means for causing at least one transition from inactive to active of the second phase of the sampling clock in response to inactive to active transitions of the first phase of the chopping clock; and
means for causing at least one transition from inactive to active of the second phase of the sampling clock in response to inactive to active transitions of the second phase of the chopping clock.

15. A switched capacitor converter according to claim 14, wherein the means for causing transitions is asynchronous.

16. A method of analog-to-digital conversion, the method comprising steps of:
providing a switched capacitor, chopper-stabilized sigma-delta modulator comprising a first summer, a quantizer, and at least one integrator;
generating a first phase of a sampling clock, a second phase of the sampling clock, a first phase of a chopping clock, and a second phase of the chopping clock, the first and second phases of the sampling clock being non-overlapping, the first and second phases of the chopping clock being non-overlapping, wherein transitions from active to inactive of the first and second phases of the chopping clock occur when the first phase and the second phase of the sampling clock are inactive and transitions from inactive to active of the first and second phases of the chopping clock occur when the first phase and the second phase of the sampling clock are inactive;
providing the first phase of the sampling clock and the second phase of the sampling clock to the modulator for switching capacitors of the modulator; and
providing the first phase of the chopping clock and the second phase of the chopping clock to the at least one integrator for chopper stabilization of the modulator, wherein:
the step of generating is performed so that at least one transition from inactive to active of the second phase of the sampling clock occurs in response to inactive to active transitions of the first phase of the chopping clock, and at least one transition from inactive to active of the second phase of the sampling clock occurs in response to inactive to active transitions of the second phase of the chopping clock.

17. A method according to claim 16, wherein the step of generating comprises operating an asynchronous state machine for generating the sampling and chopping clocks.

18. A method according to claim 17, wherein the step of providing the quantizer comprises providing a comparator.

19. A method according to claim 17, wherein the step of providing the quantizer comprises providing a two-bit quantizer.

20. A method according to claim 17, wherein the step of providing the quantizer comprises providing a multi-bit quantizer.

21. A method according to claim 17, wherein the asynchronous state machine comprises one or more asynchronous delay mechanisms for controlling the clock transitions.

22. A method according to claim 17, further comprising providing a second summer and a feedforward amplifier in a feedforward path between a first integrator of the at least of integrator and the second summer.

23. A method according to claim 22, further comprising providing a feedback digital-to-analog converter in a feedback path from the quantizer to the first summer.

24. A method according to claim 23, wherein the step of providing at least one integrator comprises providing a plurality of integrators, wherein each integrator of the plurality of integrators is configured with chopper stabilization.

25. A method according to claim 23, wherein the step of providing at least one integrator comprises providing a first integrator and a second integrator, the first integrator being coupled to the first summer to receive output of the first summer, the second integrator being coupled to the second summer to provide an input to the second summer, wherein the first integrator is configured with chopper stabilization, and the second integrator is configured without chopper stabilization.

26. A method according to claim 23, wherein the step of providing the at least one integrator comprises providing the at least one integrator configured for differential operation.

27. A method according to claim 23, wherein the step of generating is performed so that frequency of the sampling clock is twice frequency of the chopping clock.

28. A method according to claim 23, wherein the step of generating is performed so that frequency of the sampling clock is an integer multiple of frequency of the chopping clock, the integer multiple being greater than 1.

29. A method of analog-to-digital conversion, the method comprising steps of:
providing a switched capacitor, chopper-stabilized sigma-delta modulator comprising at least one summer, a quantizer, and at least one integrator;
step for generating a first phase of a sampling clock, a second phase of the sampling clock, a first phase of a chopping clock, and a second phase of the chopping clock, the first and second phases of the sampling clock being non-overlapping, the first and second phases of the chopping clock being non-overlapping, wherein transitions from active to inactive of the first and second phases of the chopping clock occur when the first phase and the second phase of the sampling clock are inactive, and transitions from inactive to active of the first and second phases of the chopping clock occur when the first phase and the second phase of the sampling clock are inactive,
providing the first phase of the sampling clock and the second phase of the sampling clock to the modulator for switching capacitors of the modulator; and
providing the first phase of the chopping clock and the second phase of the chopping clock to the at least one integrator for chopper stabilization of the modulator,
wherein the step of generating is performed so that at least one transition from inactive to active of the second phase of the sampling clock occurs in response to inactive to active transitions of the first phase of the chopping clock, and at least one transition from inactive to active of the second phase of the sampling clock occurs in response to inactive to active transitions of the second phase of the chopping clock.

30. A non-transitory storage medium having processor-executable instructions stored thereon, the instructions being configured to cause a processor to perform operations comprising:
generating a first phase of a sampling clock, a second phase of the sampling clock, a first phase of a chopping clock, and a second phase of the chopping clock, the first and second phases of the sampling clock being non-overlapping, the first and second phases of the chopping clock being non-overlapping, wherein transitions from active to inactive of the first and second phases of the chopping clock occur when the first phase and the second phase of the sampling clock are inactive and transitions from inactive to active of the first and second phases of the chopping clock occur when the first phase and the second phase of the sampling clock are inactive;
providing the first phase of the sampling clock and the second phase of the sampling clock to a chopper-stabilized sigma-delta modulator for switching capacitors of the modulator; and
providing the first phase of the chopping clock and the second phase of the chopping clock to at least one integrator for chopper stabilization of the modulator, wherein:
generating a first phase of a sampling clock is performed so that at least one transition from inactive to active of the second phase of the sampling clock occurs in response to inactive to active transitions of the first phase of the chopping clock, and at least one transition from inactive to active of the second phase of the sampling clock occurs in response to inactive to active transitions of the second phase of the chopping clock.

31. The non-transitory storage medium of claim 30, wherein the stored processor-executable software instructions are configured to cause the processor to perform further operations comprising:
operating an asynchronous state machine for generating the sampling and chopping clocks.

32. The non-transitory storage medium of claim 31, wherein the stored processor-executable software instructions are configured to cause the processor to perform further operations comprising:
performing a quantization comparison.

33. The non-transitory storage medium of claim 31, wherein the stored processor-executable software instructions are configured to cause the processor to perform further operations comprising:
operating a two-bit quantizer to perform a quantization operation.

34. The non-transitory storage medium of claim 31, wherein the stored processor-executable software instructions are configured to cause the processor to perform further operations comprising:
operating a multi-bit quantizer to perform a quantization operation.

35. The non-transitory storage medium of claim 31, wherein the stored processor-executable software instructions are configured such that operating an asynchronous state machine comprises operating one or more asynchronous delay mechanisms to control the clock transitions.

36. The non-transitory storage medium of claim 31, wherein the stored processor-executable software instructions are configured to cause the processor to perform further operations comprising:
operating a summer and a feedforward amplifier in a feedforward path between an integrator and the summer.

37. The non-transitory storage medium of claim 36, wherein the stored processor-executable software instructions are configured to cause the processor to perform further operations comprising:
 operating a feedback digital-to-analog converter in a feedback path from a quantizer to the summer.

38. The non-transitory storage medium of claim 37, wherein the stored processor-executable software instructions are configured to cause the processor to perform further operations comprising:
 configuring each integrator in a plurality of integrators with chopper stabilization.

39. The non-transitory storage medium of claim 37, wherein the stored processor-executable software instructions are configured to cause the processor to perform further operations comprising:
 configuring a first integrator in a plurality of integrators with chopper stabilization; and
 configuring a second integrator in the plurality of integrators without chopper stabilization.

40. The non-transitory storage medium of claim 37, wherein the stored processor-executable software instructions are configured to cause the processor to perform further operations comprising:
 configuring at least one integrator in a plurality of integrators for differential operation.

41. The non-transitory storage medium of claim 37, wherein the stored processor-executable software instructions are configured to cause the processor to perform further operations comprising:
 generating a frequency of the sampling clock to be twice the frequency of the chopping clock.

42. The non-transitory storage medium of claim 37, wherein the stored processor-executable software instructions are configured to cause the processor to perform further operations comprising:
 generating a frequency of the sampling clock to be an integer multiple of frequency of the chopping clock, the integer multiple being greater than 1.

* * * * *